United States Patent
Xie et al.

(10) Patent No.: US 10,787,731 B2
(45) Date of Patent: Sep. 29, 2020

(54) MASK, EVAPORATION DEVICE AND APPARATUS

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Fei Xie, Beijing (CN); Fujiang Jin, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

(*) Notice: Subject to any disclaimer, the term of this patent is extended or adjusted under 35 U.S.C. 154(b) by 29 days.

(21) Appl. No.: 16/059,683

(22) Filed: Aug. 9, 2018

(65) Prior Publication Data

US 2019/0185985 A1    Jun. 20, 2019

(30) Foreign Application Priority Data

Dec. 15, 2017 (CN) .......................... 2017 1 1352634

(51) Int. Cl.
| | | |
|---|---|---|
| C23C 14/04 | (2006.01) | |
| C23C 14/24 | (2006.01) | |
| H01L 51/56 | (2006.01) | |
| B05C 21/00 | (2006.01) | |
| H01L 51/00 | (2006.01) | |

(52) U.S. Cl.
CPC .......... *C23C 14/042* (2013.01); *B05C 21/005* (2013.01); *C23C 14/24* (2013.01); *H01L 51/56* (2013.01); *H01L 51/0011* (2013.01)

(58) Field of Classification Search
None
See application file for complete search history.

(56) References Cited

U.S. PATENT DOCUMENTS

| | | | | |
|---|---|---|---|---|
| 2005/0248260 A1* | 11/2005 | Sellars | ................ | H01L 51/0017 313/500 |
| 2018/0202034 A1* | 7/2018 | Lin | ........................ | C23C 14/042 |
| 2018/0209029 A1 | 7/2018 | Lin et al. | | |

FOREIGN PATENT DOCUMENTS

| | | | | |
|---|---|---|---|---|
| CN | 105839052 A | * | 8/2016 | ........... C23C 14/042 |
| CN | 205420527 U | | 8/2016 | |
| CN | 205662587 U | | 10/2016 | |
| CN | 106086782 A | | 11/2016 | |
| CN | 106884140 A | | 1/2017 | |
| CN | 205856592 U | | 1/2017 | |

(Continued)

OTHER PUBLICATIONS

The First Chinese Office Action dated Jul. 2, 2019; Appln. No. 201711352634.3.

*Primary Examiner* — Jethro M. Pence (57) ABSTRACT

At least one embodiment of the present disclosure provides a mask, an evaporation device and an apparatus. The mask includes at least one first mask strip and at least one second mask strip intersected with each other, wherein the mask is configured to form a component of an apparatus and includes a mask pattern for forming the component, and in an intersection region of the first mask strip and the second mask strip, the first mask strip and the second mask strip together constitute a portion of the mask pattern.

7 Claims, 4 Drawing Sheets

(56) References Cited

FOREIGN PATENT DOCUMENTS

| CN | 206692714 U | 12/2017 |
|----|-------------|---------|
| KR | 1020110021090 A | 3/2011 |
| KR | 1020140061899 A | 5/2014 |

* cited by examiner

MASK, EVAPORATION DEVICE AND APPARATUS

TECHNICAL FIELD

At least one embodiment of the present disclosure relates to a mask, an evaporation device and an apparatus.

BACKGROUND

As popularity of an electronic display product, users' requirements for functions and appearance of the electronic display product are further increased. For example, for a fine mask, if a structural layer of an electronic display product formed by the mask is of a special shape (for example, are and the like), a mask strip for forming the component possibly needs to be subjected to corresponding deformation design on the basis of the original shape, and if deformation is excessive, the net stretching difficulty of the mask strip can be seriously increased, so that the mask strip extends unevenly due to deformation in the net stretching process, resulting in that accuracy of the mask is poor and yield of the electronic display product manufactured by utilizing the mask is influenced.

SUMMARY

At least one embodiment of the present disclosure provides a mask includes at least one first mask strip and at least one second mask strip intersected with each other, wherein the mask is configured to form a component of an apparatus and includes a mask pattern for forming the component, and in an intersection region of the first mask strip and the second mask strip, the first mask strip and the second mask strip together constitute a portion of the mask pattern.

For example, in the mask provided by at least one embodiment of the present disclosure, when the component is formed by using the mask, an orthogonal projection of the intersection region of the first mask strip and the second mask strip on a surface of the apparatus where the component to be formed is positioned, corresponds to a corner region of the component.

For example, in the mask provided by at least one embodiment of the present disclosure, the first mask strip extends along a first direction parallel to a first plane where the mask is positioned, and the second mask strip extends along a second direction parallel to the first plane; and the first mask strip includes at least two first sides, the second mask strip includes at least two corresponding second sides, and in the intersection region of the first mask strip and the second mask strip, an orthogonal projection of any one of the at least two first sides of the first mask strip on the first plane and an orthogonal projection of the second side corresponding to the first side of the second mask strip on the first plane constitute a smoothly connected line segment.

For example, in the mask provided by at least one embodiment of the present disclosure, in the first direction, the first mask strip includes at least one first portion and at least one second portion alternated with each other, and in a direction parallel to the first plane and perpendicular to the first direction, a width of the second portion is greater than that of the first portion, and a side of the second portion, which is connected with the first portion, is the first side; and in the second direction, the second mask strip includes at least one third portion and at least one fourth portion alternated with each other, in a direction parallel to the first plane and perpendicular to the second direction, a width of the fourth portion is greater than that of the third portion, and a side of the fourth portion, which is connected with the third portion, is the second side.

For example, in the mask provided by at least one embodiment of the present disclosure, an orthogonal projection of any one of the first sides on the first plane is at least partially overlapped with an orthogonal projection of the second side corresponding to the first plane on the first plane.

For example, in the mask provided by at least one embodiment of the present disclosure, the first mask strip is a shielding mask strip, the second mask strip is a supporting mask strip, and the second mask strip is configured to support the first mask strip.

For example, in the mask provided by at least one embodiment of the present disclosure, the line segment is of an arc shape.

For example, in the mask provided by at least one embodiment of the present disclosure, the first direction is perpendicular to the second direction, a radian of the first side is π/6 to π/4, and a radian of the second side is π/4 to π/3.

For example, in the mask provided by at least one embodiment of the present disclosure, the first direction is perpendicular to the second direction, a length of the orthogonal projection of the first side on the first plane is ⅓ to ½ of a length of the line segment, and a length of the orthogonal projection of the second side on the first plane is ½ to ⅔ of the length of the line segment.

For example, in the mask provided by at least one embodiment of the present disclosure, included angles between a direction where an extension line of the line segment is positioned and the first direction as well as the second direction are both 45 degrees.

At least one embodiment of the present disclosure provides an evaporation device which comprises the above-mentioned any mask.

At least one embodiment of the present disclosure provides an apparatus, and at least one of components of the apparatus is prepared by using the above-mentioned any mask.

For example, the apparatus comprises an organic light-emitting diode display panel, the component including one or a combination of a hole injection layer, a hole transport layer, an organic light-emitting layer, an electron transport layer, an electron injection layer and a metal electrode.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," or the like are only used to indicate relative position relationship, and when the position of the object which is described is changed, the relative position relationship may be changed accordingly.

At least one embodiment of the present disclosure provides a mask, including: at least one first mask strip and at least one second mask strip which intersect with each other, and the mask is configured to form a component of an apparatus and includes a mask pattern for forming the component, and in an intersection region of the first mask strip and the second mask strip, the first mask strip and the second mask strip together constitute a portion of the mask pattern. When a size of the component of the apparatus, which is formed by adopting the mask, is relatively large or the mask is used for forming a curved shape with a relatively large radian and the like, compared to a forming case of one single mask strip, the corresponding mask pattern is formed by two mask strips intersecting with each other, so that a problem of net stretching difficulty caused by excessive deformation of one single mask strip is eliminated, stretching unevenness caused by excessive deformation in the net stretching process of the mask strip is reduced or eliminated, and accuracy of the mask is promoted, thereby improving yield of the apparatus prepared by utilizing the mask.

Hereinafter, a mask, an evaporation device and an apparatus according to at least one embodiment of the present disclosure will be illustrated in connection with the drawings.

Figure 1:
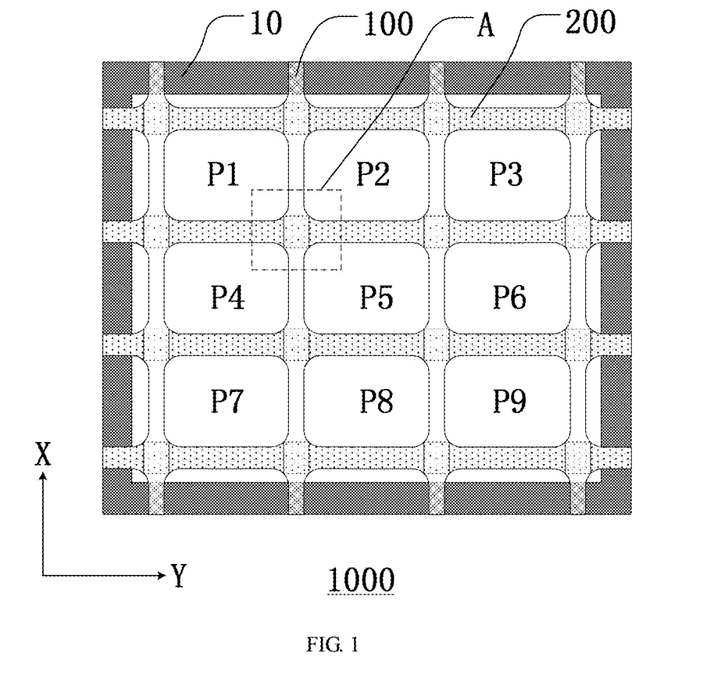
FIG. 1 is a partial structural schematic diagram of a mask provided by an embodiment of the present disclosure.
Figure 2:
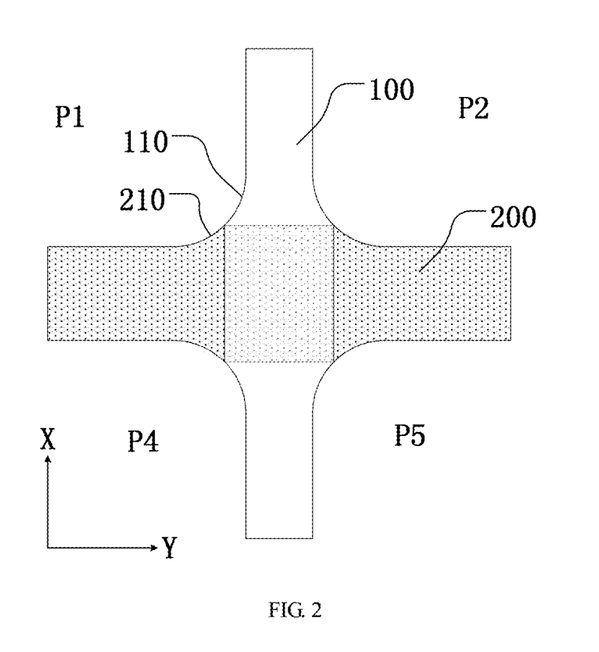
FIG. 2 is a structural schematic diagram of a region A of the mask shown in FIG. 1.

FIG. 1 is a partial structural schematic diagram of a mask provided by an embodiment of the present disclosure, and FIG. 2 is a structural schematic diagram of a region A of the mask shown in FIG. 1.

For example, in at least one embodiment of the present disclosure, as shown in FIG. 1 and FIG. 2, the mask 1000 includes at least one first mask strip 100 and at least one second mask strip 200 which intersect with each other, the mask 1000 is configured to form a component of an apparatus and includes a mask pattern for forming the component, and in an intersection region of the first mask strip and the second mask strip, e.g., the region A in FIG. 1, the first mask strip 100 and the second mask strip 200 together constitute one portion of the mask pattern. The first mask strip 100 and the second mask strip 200 together form the mask pattern for forming the component of the apparatus, so that a problem of net stretching difficulty caused by excessive deformation of one single mask strip is eliminated, stretching unevenness caused by excessive deformation in the net stretching process of the mask strip is reduced or eliminated, and accuracy of the mask 1000 is promoted, thereby improving yield of the apparatus prepared by utilizing the mask 1000.

In the embodiments of the present disclosure, a specific structure of the mask is not limited and can be designed according to demands of an actual process. Exemplarily, by taking a case that the apparatus is a display panel as an example, in the actual process, generally, a big display panel mother board is manufactured firstly and then the display panel mother board is cut into a plurality of small display panel daughter boards, and thus, the mask can be designed to be used in a manufacturing process of the display panel mother board. As shown in FIG. 1, the mask 1000 can include a plurality of first mask strips 100 and a plurality of second mask strips 200, the first mask strips 100 and the second mask strips 200, for example, can be fixed (for example, welded) on a frame 10 after being stretched and tightened by a net stretching machine, the first mask strips 100 and the second mask strips 200 intersect with each other to define a plurality of regions, e.g., regions P1 to P9 in FIG. 1 and the like, and in the process, each of the regions P1 to P9 may correspond to one display panel daughter board. It should be noted that in the mask as shown in FIG. 1, other mask strips with mask patterns may also be arranged between the adjacent first mask strips 100, the mask may also be designed to only be used to manufacture a structure of one display panel daughter board, the specific structure of the mask is designed according to a type of the component or a structure of the apparatus which need to be formed, and the embodiments of the present disclosure do not make any limit herein.

In at least one embodiment of the present disclosure, the mask may be a metal mask used in an evaporation process, and for example, a preparation material of at least one of the first mask strip 100 and the second mask strip 200 may include metal or alloy (for example, invar alloy) and the like so as to facilitate welding on the frame 10.

In the embodiments of the present disclosure, a position of the mask pattern formed by the first mask strip and the second mask strip together is not limited, as long as the mask pattern for forming the component of the apparatus is formed by the first mask strip and the second mask strip together. Exemplarily, when the mask is utilized to manufacture the component in the apparatus, the position of the mask pattern may correspond to a corner region of the component, or correspond to a central region or other regions of the component.

For example, in the mask provided by at least one embodiment of the present disclosure, when the mask is utilized to form the apparatus (the component in the apparatus), a projection (for example, an orthogonal projection) of an intersection region of the first mask strip and the second mask strip on the surface of the apparatus, where the component to be formed is positioned, corresponds to a corner region of the component. Exemplarily, as shown in FIG. 1, when the mask 1000 is utilized to manufacture the component in the apparatus, the region P1 may correspond to one apparatus, and a portion of the region P1 of the mask, which is positioned in the intersection region A, may be used for forming a related structure of the corner region of the component, i.e., the shape of a portion of the component, which is positioned on the corner region of the component, may be the same with that of the mask pattern in the region A, which is formed by the first mask strip 100 and the second mask strip 200 together. For example, in at least one embodiment of the present disclosure, in the corner region of the component, the mask pattern formed by the first mask strip 100 and the second mask strip 200 together may be used for forming an outer edge of the component.

In the following, by taking a case that the mask pattern formed by the first mask strip and the second mask strip in the intersection region thereof corresponds to the corner region of the component as an example, the technical solution in the under-mentioned at least one embodiment of the present disclosure will be illustrated below.

For example, in the mask provided by at least one embodiment of the present disclosure, the first mask strip extends along a first direction parallel to a first plane where the mask is positioned, the second mask strip extends along a second direction parallel to the first plane, the first mask strip includes at least two first sides, the second mask strip includes at least two corresponding second sides, and in the intersection region of the first mask strip and the second mask strip, an orthogonal projection of any one of the at least two first sides of the first mask strip on the first plane and an orthogonal projection of the corresponding second side of the second mask strip on the first plane constitute a smoothly connected line segment. For example, the first plane may be a surface where the mask is positioned. Exemplarily, as shown in FIG. 2, the first mask strip 100 includes at least two first sides 110, the second mask strip 200 includes at least two corresponding second sides 210, and viewing from a direction perpendicular to the first plane, a pattern formed by the first side 110 of the first mask strip 100 and the second side 210 corresponding to the first side 110 of the second mask strip 200 is a smoothly connected line segment. The mask is used for manufacturing the component in the apparatus, and thus, a shape of a portion (for example, the outer edge) of a corner region of the component is the same with that of the line segment. Compared to a case of using one single mask strip, the corresponding mask pattern is formed by two mask strips intersecting with each other, so that a problem of net stretching difficulty caused by excessive deformation of one single mask strip is eliminated, stretching unevenness caused by excessive deformation in the net stretching process of the mask strip is reduced or eliminated, and accuracy of the mask is promoted, thereby improving yield of the apparatus prepared by utilizing the mask.

In the embodiment of the present disclosure, the orthogonal projections of the first side and the second side corresponding to the first side on the first plane may constitute the smoothly connected line segment. For example, as shown in FIG. 2, by taking the first side 110 of the first mask strip 100, which is positioned in the region P1, as an example, the second side 210 of the second mask strip 200, which is positioned in the region P1, is a side corresponding to the first side 110, and both the first side 110 and the second side 210 are positioned in the same corner region of the region P1, so that the orthogonal projections of the first side 110 and the second side 210 on the first plane constitute the smoothly connected line segment.

It should be noted that the shape of the line segment is formed by the orthogonal projection of any one of the first sides of the first mask strip on the first plane and the orthogonal projection of the corresponding second side of the second mask strip on the first plane together. Therefore, the technical solution in the under-mentioned at least one embodiment of the present disclosure will be illustrated below by directly representing the shape of the line segment with the shape formed by the first side and the corresponding second side together.

In the embodiments of the present disclosure, the first mask strip and the second mask strip in the mask intersect with each other, but other position relationships between the first mask strip and the second mask strip are not specifically limited and may be designed according to a specific shape of the to-be-manufactured component in the apparatus. For example, the first direction along which the first mask strip extends and the second direction along which the second mask strip extends may intersect with each other at a random angle, and further, for example, the first direction and the second direction are perpendicular to each other. The technical solution in the under-mentioned at least one embodiment of the present disclosure will be illustrated below by taking a case that the first direction and the second direction are perpendicular to each other as an example.

In the embodiments of the present disclosure, a coordinate system may be established to carry out directional illustration on a position of each structure in the mask. For example, as shown in FIG. 1 and FIG. 2, the first direction along which the first mask strip 100 extends is parallel to a direction of an X axis, the second direction along which the second mask strip 200 extends is parallel to a direction of a Y axis, and a plane determined by X-Y may be the first plane (the surface where the mask is positioned).

For example, in the mask provided by at least one embodiment of the present disclosure, an orthogonal projection of any one of the first sides on the first plane is at least partially overlapped with an orthogonal projection of the corresponding second side on the first plane. In the actual process, sizes of the first mask strip and the second mask strip possibly have a slight error or possibly may be slightly moved after net stretching, and thus, a safety allowance may be set, and for example, the first side and the corresponding second side are set to be partially overlapped with each other, so that continuity of the line segment can be ensured, and accuracy of the mask can be improved. Exemplarily, as shown in FIG. 2, in the direction perpendicular to the first plane, the first side 110 and the corresponding second side 210 are partially overlapped, so that after net stretching is carried out on the mask strips, the shape (a shape formed by the first side 110 and the corresponding second side 210 together) of the line segment can be guaranteed to be continuous.

It should be noted that if the accuracy of the mask strip can be guaranteed and the error generated by factors of movement and the like can be guaranteed not to be generated in the net stretching process, the first side and the corresponding second side may also be designed into that only end points are overlapped, i.e., the line segment is smoothly connected, and a length of the line segment is the sum of a length of the first side and a length of the corresponding second side.

Figure 3A:
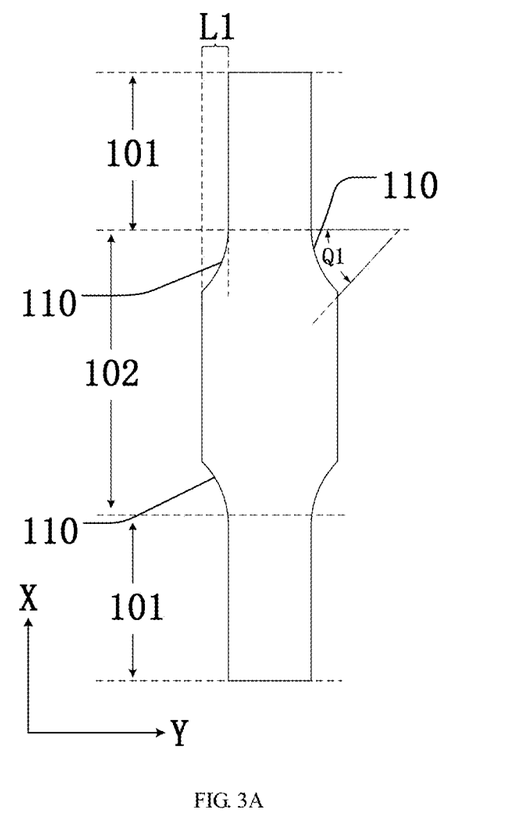
FIG. 3A a local structural schematic diagram of a first mask strip in the mask shown in FIG. 2.
Figure 3B:
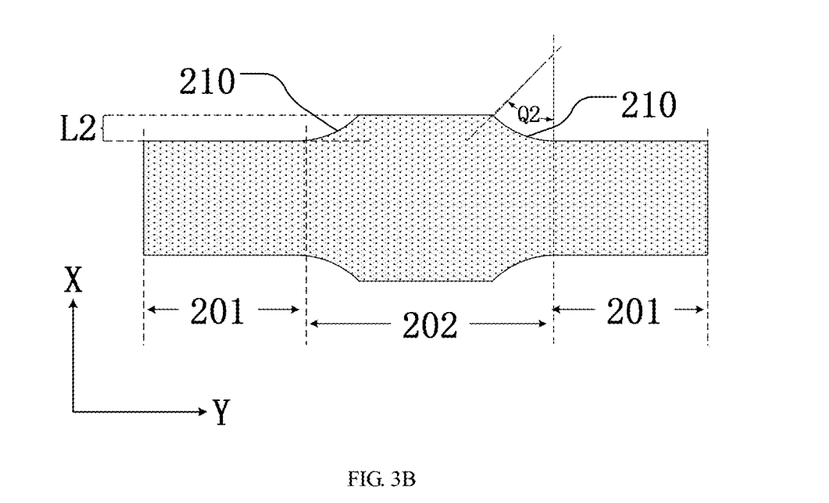
FIG. 3B is a local structural schematic diagram of a second mask strip in the mask shown in FIG. 2.

FIG. 3A is a local structural schematic diagram of the first mask strip in the mask shown in FIG. 2, and FIG. 3B is a local structural schematic diagram of the second mask strip in the mask shown in FIG. 2.

For example, in the mask provided by at least one embodiment of the present disclosure, in the first direction, the first mask strip includes at least one first portion and at least one second portion which alternate with each other, and in a direction parallel to the first plane and perpendicular to the first direction, a width of the second portion is greater than that of the first portion, and a side of the second portion, which is connected with the first portion, is the first side; and in the second direction, the second mask strip includes at least one third portion and at least one fourth portion which alternate with each other, and in a direction parallel to the first plane and perpendicular to the second direction, a width of the fourth portion is greater than that of the third portion, and a side of the fourth portion, which is connected with the third portion, is the second side.

Exemplarily, as shown in FIG. 3A, in the first direction (a direction parallel to the X axis), the first mask strip 100 includes at least one first portion 101 and at least one second portion 102 which alternate with each other, and in the direction (a direction parallel to the Y axis) perpendicular to the first direction, a width of the second portion 102 is greater than that of the first portion 101, and a side of the second portion 102, which is connected with the first portion 101, is the first side 110. It should be noted that it is for the whole that the width of the second portion 102 is greater than that of the first portion 101, and in a case that the edge of the first portion 101 and the edge of the second portion 102 are smoothly connected, at a joint of the first portion 101 and the second portion 102, the width of the first portion 101 and the width of the second portion 102 are the same. As shown in FIG. 3A, a range of a difference value obtained by subtracting the width of the first portion 101 from the width of the second portion 102 is 0 to 2L1.

Exemplarily, as shown in FIG. 3B, in the second direction (the direction parallel to the Y axis), the second mask strip 200 includes at least one third portion 201 and at least one fourth portion 202 which alternate with each other, and in the direction (the direction parallel to the X axis) perpendicular to the second direction, a width of the fourth portion 202 is greater than that of the third portion 201, and a side of the fourth portion 202, which is connected with the third portion 201, is the second side 210. It should be noted that it is for the whole that the width of the fourth portion 202 is greater than that of the third portion 201, and in a case that the side of the third portion 201 and the side of the fourth portion 202 are smoothly connected, at a joint of the third portion 201 and the fourth portion 202, the width of the third portion 201 and the width of the fourth portion 202 are the same. As shown in FIG. 3A, a range of a difference value obtained by subtracting the width of the third portion 201 from the width of the fourth portion 202 is 0 to 2L2.

In the embodiments of the present disclosure, a shape (a shape formed by the first side and the corresponding second side together) of the line segment is not limited. Exemplarily, the shape of the line segment may be a curve line shape (for example, an arc shape and the like), a straight line shape, a sawtooth shape or a wave shape and the like.

For example, in at least one embodiment of the present disclosure, the shape (the shape formed by the first side and the corresponding second side together) of the line segment may be an arc shape. Therefore, in the component manufactured by utilizing the mask, the shape of the portion of the corner region of the component is an arc shape, and correspondingly, the mask may also be applicable to a manufacturing process (for example, an evaporation process) of the component of which the corner is of an arc shape.

In the embodiments of the present disclosure, types of the first mask strip and the second mask strip are not limited. For example, in the mask provided by at least one embodiment of the present disclosure, the first mask strip may be a shielding mask strip, the second mask strip may be a supporting mask strip, and the second mask strip is configured to support the first mask strip. Exemplarily, as shown in FIG. 1, FIG. 2, FIG. 3A and FIG. 3B, the first mask strip 100 may be the shielding mask strip, and the mask pattern may be formed by the first mask strip 100 for forming other portions (for example, portions of the component, which do not correspond to the intersection region A) of the component in the apparatus; and the second mask strip 200 is the supporting mask strip and is generally arranged between a frame 10 and the shielding mask strip 100, and in the process of the evaporation process for example, the supporting mask strip 200 supports the shielding mask strip 100 so as to avoid deformation of the shielding mask strip 100, which occurs due to droop. It should be noted that the mask pattern may also be arranged in the supporting mask strip, a specific structure of the supporting mask strip may be designed according to a structure of the component which needs to be obtained, and the embodiments of the present disclosure do not repeat it herein.

In the embodiments of the present disclosure, a length ratio relationship between the first side and the corresponding second side is not limited, and can be designed according to actual demands. For example, by taking a case that the line segment is of an arc shape, in the mask provided by at least one embodiment of the present disclosure, the first direction is perpendicular to the second direction, a radian of the first side is $\pi/6$ to $\pi/4$, and a radian of the second side is $\pi/4$ to $\pi/3$. Exemplarily, as shown in FIG. 3A, a range of a radian Q1 of the first side 110 may be $\pi/6$ to $\pi/4$; and as shown in FIG. 3B, a range of a radian Q2 of the second side 210 of the second mask strip 200 may be $\pi/4$ to $\pi/3$. It should be noted that in the embodiments of the present disclosure, the radian ranges of the first side and the corresponding second side are not limited to the above-mentioned value ranges, as long as a radian of the line segment is formed by the radian of the first side and the radian of the corresponding second side together.

Generally speaking, the second mask strip (the supporting mask strip) mainly takes a supporting effect, and thus, intensity of the second mask strip generally may be greater than that of the first mask strip (the shielding mask strip), and moreover, a width of the second mask strip may also be designed to be greater than that of the first mask strip, and thus, compared to the first mask strip, the second mask strip can bear larger deformation. Exemplarily, a width of an L2 region of the second mask strip 200 as shown in FIG. 3B may be greater than that of an L1 region of the first mask strip 100 as shown in FIG. 3A. Therefore, deformation in the first mask strip 100 can be further reduced, and overall accuracy of the mask can be promoted.

Exemplarily, as shown in FIG. 3A and FIG. 3B, the radian Q1 of the first side 110 may be $\pi/6$, and the radian Q2 of the second side 210 may be $\pi/3$, and thus, the first side 110 and the corresponding second side 210 may constitute a line segment with a radian of $\pi/2$. Or, exemplarily, as shown in FIG. 3A and FIG. 3B, the radian Q1 of the first side 110 may be $2\pi/9$, and the radian Q2 of the second side 210 may be $\pi/3$, and thus, in a case that the first side 110 and the corresponding second side 210 may constitute the line segment with the radian of $\pi/2$, a radian of an overlapped portion of the first side 110 and the corresponding second side 210 is π/36, and in the actual process, an allowance of the π/36 can ensure that the first side 110 and the corresponding second side 210 constitute a continuous line segment.

For example, in at least one embodiment of the present disclosure, the radian of the line segment is π/2, a tangent of one end point of the line segment is substantially parallel to the first direction, and a tangent of the other end point of the line segment is substantially parallel to the second direction. Exemplarily, as shown in FIG. 2, FIG. 3A and FIG. 3B, the radian of the line segment formed by the first side 110 and the corresponding second side 210 may be 3π/2, so that the portion of the corner region of the component of the apparatus manufactured by the mask is also of an arc shape with a radian of π/2. As shown in FIG. 3A, a tangent of the end point of the first side 110, which is connected with the first portion 101, may be parallel to the first direction, i.e., the first side 110 may be smoothly connected with the edge of the first portion 101; and as shown in FIG. 3B, a tangent of the end point of the second side 210, which is connected with the third portion 201, may be parallel to the second direction, i.e., the second side 210 may be smoothly connected with the edge of the third portion 201, so that the tangent of one end point of the line segment may be substantially parallel to the first direction, and the tangent of the other end point of the line segment may be substantially parallel to the second direction, and thus, the portion of the corner region of the component in the apparatus, such as a portion between an outer edge and an adjacent side of the outer edge, is also in smooth connection.

It is noted that "substantially parallel" means that the tangent of the other end point of the line segment may be parallel to the second direction or an angle may be formed between the tangent of the other end point of the line segment and the second direction, wherein the angle may be in a range of 0 degree to 20 degree.

Figure 4:
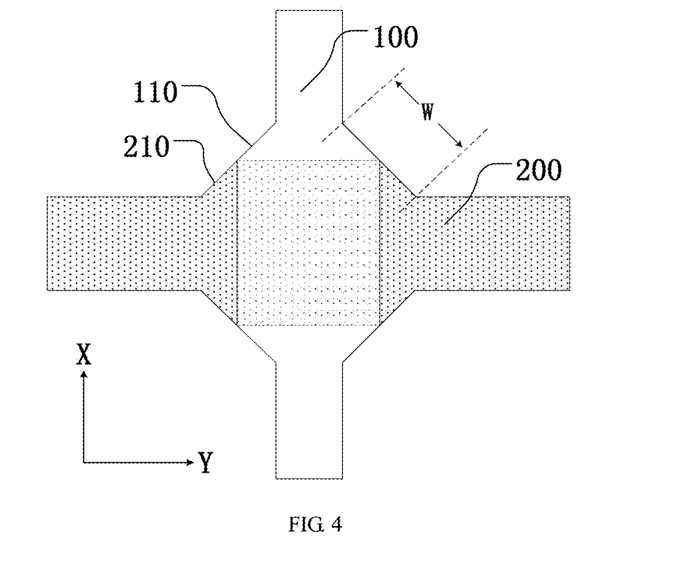
FIG. 4 is another structural schematic diagram of the region A of the mask shown in FIG. 1.
Figure 5A:
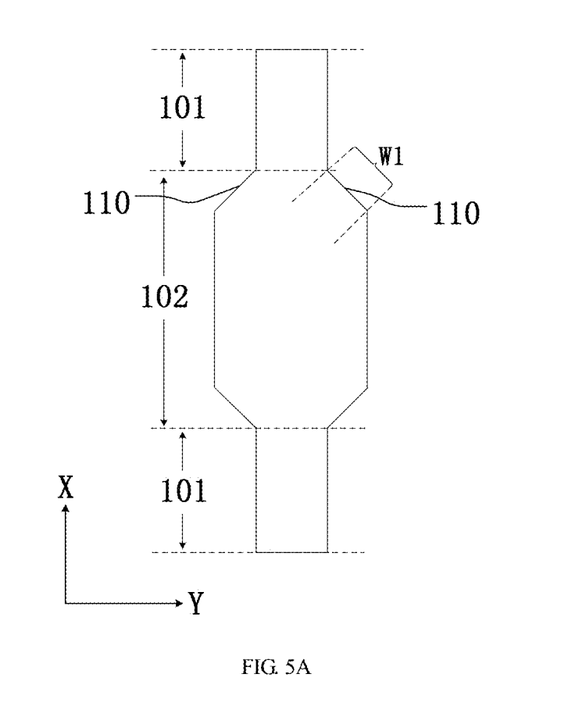
FIG. 5A is a local structural schematic diagram of a first mask strip in the mask shown in FIG. 4.
Figure 5B:
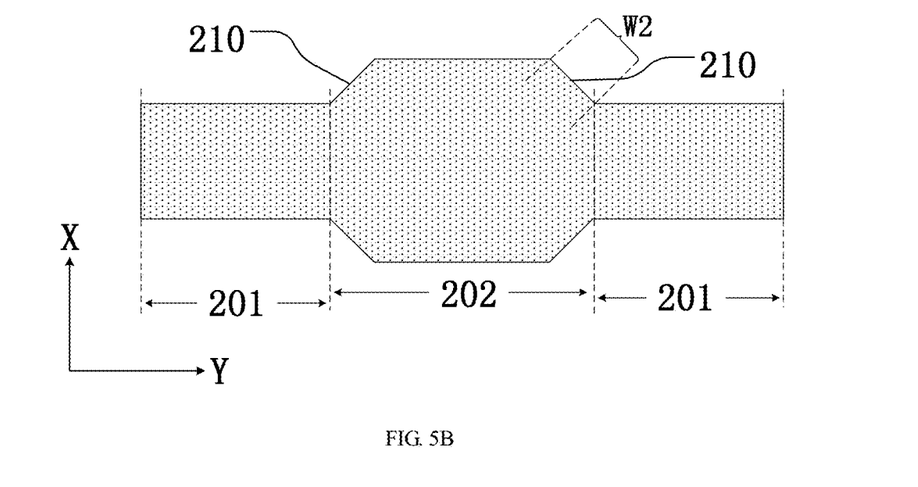
FIG. 5B is a local structural schematic diagram of a second mask strip in the mask shown in FIG. 4.

For example, in the mask provided by at least one embodiment of the present disclosure, the line segment is a straight line segment. FIG. 4 is another structural schematic diagram of a region A of the mask shown in FIG. 1, FIG. 5A is a local structural schematic diagram of the first mask strip in the mask shown in FIG. 4, and FIG. 5B is a local structural schematic diagram of the second mask strip in the mask shown in FIG. 4. Exemplarily, as shown in FIG. 4, FIG. 5A and FIG. 5B, the line segment formed by the first side 110 of the first mask strip 100 and the corresponding second side 210 of the second mask strip 200 may be a straight line segment. Therefore, in a component manufactured by utilizing the mask, the portion of the corner region of the component is of a shape of a straight line segment (for example, a corner of the component may be a chamfer), and correspondingly, the mask may be applicable to a manufacturing process (for example, an evaporation process) of the apparatus with the component of which the corner is of a shape of a straight line segment.

In the embodiments of the present disclosure, a length ratio relationship between the first side and the corresponding second side is not limited, and may be designed according to actual demands. For example, in the mask provided by at least one embodiment of the present disclosure, the first direction is perpendicular to the second direction, a length of an orthogonal projection of the first side on the first plane is ⅓ to ½ of a length of the line segment, and a length of the orthogonal projection of the second side on the first plane is ½ to ⅔ of the length of the line segment. Exemplarily, by taking a length W (a total length after the first side 110 and the corresponding second side 210 are overlapped) of the line segment as shown in FIG. 4 as a base, as shown in FIG. 5A, a ratio W1/W of the length of the first side 110 to the length of the line segment is about ⅓ to ½; and as shown in FIG. 5B, a ratio W2/W of the length of the second side 210 to the length of the line segment is about ½ to ⅔. It should be noted that in the embodiments of the present disclosure, ranges of the ratios of the lengths of the first side and the corresponding second side to the length of the line segment are not limited to the above-mentioned value range, as long as the line segment is formed by the first side and the corresponding second side together.

For example, in the embodiments of the present disclosure, in a case that the first mask strip is a shielding mask strip and the second mask strip is a supporting mask strip, the length of the second side 210 of the second mask strip 200 as shown in FIG. 5B may be designed to be greater than the length of the first side 110 of the first mask strip 100 as shown in FIG. 5A. Therefore, deformation in the first mask strip 100 can be further reduced, and overall accuracy of the mask can be promoted.

Exemplarily, as shown in FIG. 5A and FIG. 5B, the ratio of the length of the first side 110 to the length of the line segment may be ⅓, and the ratio of the length of the second side 210 to the length of the line segment may be ⅔, so that the end points of the first side 110 and the corresponding second side 210 coincide to form the line segment. Or, exemplarily, as shown in FIG. 5A and FIG. 5I, the ratio of the length of the first side 110 to the length of the line segment may be ½, and the ratio of the length of the second side 210 to the length of the line segment may be ⅔, so that the first side 110 and the corresponding second side 210 are partially overlapped to form the line segment, an overlapped portion of the first side 110 and the corresponding second side 210 occupies for 1/12 of a total length of the line segment, and in the actual process, the allowance of the 1/12 of the length can ensure that the first side 110 and the corresponding second side 210 constitute the continuous line segment.

For example, in the mask provided by at least one embodiment of the present disclosure, included angles between a direction where an extension line of the line segment is positioned and the first direction as well as the second direction are both 45 degrees. Exemplarily, in a case that the first direction is perpendicular to the second direction, as shown in FIG. 4, FIG. 5A and FIG. 5B, an included angle between the line segment formed by the first side 110 and the corresponding second side 210 and the first direction is equal to an included angle between the line segment and the second direction, so that included angles between the portion of the component of the apparatus manufactured by the mask and adjacent sides thereof are also equal, i.e., a shape of the outer edge of the component or the apparatus may be an octagon of which interior angles are all 135 degrees.

At least one embodiment of the present disclosure provides a mask strip. The mask strip may constitute a portion of a mask pattern. The mask pattern is configured to be used to form a component of an apparatus, and at least two above-mentioned mask strips constitute the mask pattern together. Therefore, each mask strip only constitutes a portion of the mask pattern, and compared to a case of forming the mask pattern by one single mask strip, a case of forming the mask pattern by at least two mask strips eliminates a problem of net stretching difficulty caused by excessive deformation of one single mask strip, and reduces or eliminates stretching unevenness caused by excessive deformation in the net stretching process of the mask strip, so that accuracy of the mask is promoted and yield of the apparatus prepared by utilizing the mask is improved. For example, the specific structure of the above-mentioned mask strip may refer to the design structure of the first mask strip and/or the second mask strip in the above-mentioned embodiments (the embodiments related to the mask), and the embodiments of the present disclosure does not repeat it herein.

At least one embodiment of the present disclosure provides an evaporation device. The evaporation device includes the mask in any one of the above-mentioned embodiments. For example, in at least one embodiment of the present disclosure, the evaporation device may further include structures, such as an evaporation chamber, an evaporation source, a fixing member and the like. For example, by taking a case that a to-be-evaporated apparatus is a substrate as an example, the evaporation process may include: heating an evaporation material in the evaporation source, so that atoms or molecules in the evaporation material are gasified to overflow to form steam flow and after being led to the substrate, a gaseous evaporation material is condensed to form a solid thin film. For example, the evaporation chamber may be a vacuum evaporation chamber. For example, the evaporation source may include a point-type evaporation source or a line-type evaporation source and the like. The fixing member may fix and limit the substrate so as to ensure evaporation yield of the substrate.

At least one embodiment of the present disclosure provides an apparatus. At least on component of the apparatus is prepared by the mask in at least one of the above-mentioned embodiments. The first mask strip and the second mask strip constitute a mask pattern for forming the component in the apparatus together, so that the net stretching difficulty of each mask strip can be reduced, and accuracy of the mask can be promoted, thereby improving yield of the apparatus prepared by utilizing the mask. In the embodiments of the present disclosure, the type of the apparatus is not limited, as long as in the manufacturing process of the apparatus, the component in the apparatus needs to be manufactured by utilizing the mask in the above-mentioned embodiments.

For example, in at least one embodiment of the present disclosure, the apparatus may be a display panel. The display panel may include a display region.

For example, the component formed by utilizing the mask may correspond to the display region, so that at the intersection region of the first mask strip and the second mask strip, a shape of the mask pattern formed by the first mask strip and the second mask strip together may correspond to a shape of a corner region of the display region. Exemplarily, by taking a case that as shown in FIG. 2, the first side 110 and the corresponding second side 210 constitute an arc line segment (the mask pattern) as an example, a corner of the display region of the display panel may also be of an arc shape, i.e., the display panel may have a fillet display function.

For example, the component formed by utilizing the mask may correspond to the overall apparatus, so that in the intersection region of the first mask strip and the second mask strip, the shape of the mask pattern formed by the first mask strip and the second mask strip may correspond to a shape of the corner region of the apparatus. Exemplarily, by taking the case that as shown in FIG. 2, the first side 110 and the corresponding second side 210 constitute an arc line segment (the mask pattern) as the example, a corner of the display panel may also be of an arc shape.

It should be noted that by taking a case that the apparatus is a display panel as an example, the shape of the display panel may be similar with that of the display region of the display panel, i.e., the corner of the display panel is of an arc shape, and the corner of the display region of the display panel may also be of an arc shape.

For example, in the apparatus provided by at least one embodiment of the present disclosure, the apparatus includes an organic light-emitting diode display panel, and the component includes one or a combination of a hole injection layer, a hole transport layer, an organic light-emitting layer, an electron transport layer, an electron injection layer, a metal electrode and the like. Certainly, the mask provided by the embodiments of the present disclosure may also be used for manufacturing other types of display panels or other apparatus of which manufacturing processes are related to the mask.

For example, in the apparatus provided by at least one embodiment of the present disclosure, the apparatus may be a liquid crystal display panel, and the component may include one or a combination of a pixel electrode, a common electrode, an active layer and the like. Certainly, the mask provided by the embodiments of the present disclosure may also be used for manufacturing other types of display panels or other apparatus of which manufacturing processes are related to the mask.

In the embodiments of the present disclosure, the specific structure of the mask for forming the component of the apparatus may refer to the related contents in the above-mentioned embodiments (the embodiments related to the mask), and the embodiments of the present disclosure do not repeat it herein.

It should be noted that in the embodiments of the present disclosure, the component may be in an original form of a material layer formed in the apparatus by the mask, but not limited to a final form in the apparatus. A case that the apparatus includes the organic light-emitting diode display panel is taken as an example. Exemplarily, an evaporation process may be carried out by the mask so as to form a metal thin film in the apparatus, the metal thin film may be used as a metal electrode, e.g., a cathode, of an organic light-emitting device, and the cathode may be the component signified in the embodiments of the present disclosure. Or, exemplarily, after the evaporation process is carried out on the apparatus by the mask, the metal thin film is formed in the apparatus, then patterning processing may be carried out on the metal thin film by a photolithography process for example so as to form structures in the display panel, e.g., a signal line and the like, and the metal thin film before the signal line is formed is the component signified in the embodiments of the present disclosure.

The embodiments of the present disclosure provide a mask, an evaporation device and an apparatus, and may have at least one of advantageous effects below:

(1) In the mask provided by at least one embodiment of the present disclosure, when the size of the component of the apparatus, which is formed by adopting the mask, is relatively large or the mask is used for forming a curved shape with a relatively large radian and the like, compared to the forming case using one single mask strip, the corresponding mask pattern is formed by two mask strips intersecting with each other, so that the problem of net stretching difficulty caused by excessive deformation of one single mask strip is eliminated, stretching unevenness caused by excessive deformation in the net stretching process of the mask strip is reduced or eliminated, thereby promoting accuracy of the mask and improving yield of the apparatus prepared by utilizing the mask.

(2) In the mask provided by at least one embodiment of the present disclosure, in the case that the first mask strip is the shielding mask strip and the second mask strip is the supporting mask strip, for a total length of a line segment formed by projections of the first side and the corresponding second side, an occupied ratio of the second side is greater than that of the first side, so that deformation of the first mask strip is further reduced, the difficulty of the first mask strip in the net stretching process is reduced, and accuracy of the mask is improved.

The following statements should be noted:

(1) Unless otherwise defined, the same reference number is denoted as the same meaning in the embodiments of the accompanying drawings of the present disclosure.

(2) The accompanying drawings involve only the structure(s) in connection with the embodiment(s) of the present disclosure, and other structure(s) can be referred to common design(s).

(3) For the purpose of clarity only, in accompanying drawings for illustrating the embodiment(s) of the present disclosure, the thickness and size of a layer or a structure may be enlarged, that is, the accompanying drawings are not drawn according to the actual scale. However, it should understood that, in the case in which a component or element such as a layer, film, region, substrate or the like is referred to be "on" or "under" another component or element, it may be directly on or under the another component or element or a component or element is interposed therebetween.

(4) In case of no conflict, features in one embodiment or in different embodiments can be combined.

What are described above is related to the specific embodiments of the disclosure only and not limitative to the scope of the disclosure. The protection scope of the disclosure shall be based on the protection scope of the claims.

The application claims priority to the Chinese patent application No. 201711352634.3, filed Dec. 15, 2017, the disclosure of which is incorporated herein by reference as part of the application.

The invention claimed is:

1. A mask, comprising:
at least one first mask strip and at least one second mask strip, intersected with each other;
wherein the mask is configured to form a component of an apparatus and includes a mask pattern for forming the component, and in an intersection region of the first mask strip and the second mask strip, the first mask strip and the second mask strip together constitute a portion of the mask pattern,
wherein
the first mask strip extends along a first direction parallel to a first plane where the mask is positioned, and the second mask strip extends along a second direction parallel to the first plane; and
the first mask strip includes at least two first sides, the second mask strip includes at least two corresponding second sides, and
in the intersection region of the first mask strip and the second mask strip, an orthogonal projection of any one of the at least two first sides of the first mask strip on the first plane and an orthogonal projection of the second side corresponding to the first side of the second mask strip on the first plane constitute a smoothly connected line segment,
wherein the line segment is of an arc shape.

2. The mask according to claim 1, wherein
an orthogonal projection of the intersection region of the first mask strip and the second mask strip on a surface of the apparatus where the component to be formed is positioned, corresponds to a corner region of the component.

3. The mask according to claim 1, wherein
in the first direction, the first mask strip includes at least one first portion and at least one second portion alternated with each other, and in a direction parallel to the first plane and perpendicular to the first direction, a width of the second portion is greater than that of the first portion, and a side of the second portion, which is connected with the first portion, is the first side; and
in the second direction, the second mask strip includes at least one third portion and at least one fourth portion alternated with each other, in a direction parallel to the first plane and perpendicular to the second direction, a width of the fourth portion is greater than that of the third portion, and a side of the fourth portion, which is connected with the third portion, is the second side.

4. The mask according to claim 1, wherein
an orthogonal projection of any one of the first sides on the first plane is at least partially overlapped with an orthogonal projection of the second side corresponding to the first plane on the first plane.

5. The mask according to claim 1, wherein
the first mask strip is a shielding mask strip, the second mask strip is a supporting mask strip, and the second mask strip is configured to support the first mask strip.

6. The mask according to claim 1, wherein
the first direction is perpendicular to the second direction, a radian of the first side is $\pi/6$ to $\pi/4$, and a radian of the second side is $\pi/4$ to $\pi/3$.

7. The mask according to claim 6, wherein
a radian of the line segment is $\pi/2$, a tangent of one end point of the line segment is substantially parallel to the first direction, and a tangent of the other end point of the line segment is substantially parallel to the second direction.

* * * * *